United States Patent
Coxon

(10) Patent No.: US 9,111,977 B2
(45) Date of Patent: Aug. 18, 2015

(54) WORK PIECE TRANSFER MECHANISMS

(75) Inventor: Peter Coxon, East Sussex (GB)

(73) Assignee: UHV DESIGN LIMITED, East Sussex (GB)

( * ) Notice: Subject to any disclaimer, the term of this patent is extended or adjusted under 35 U.S.C. 154(b) by 126 days.

(21) Appl. No.: 13/994,160

(22) PCT Filed: Dec. 19, 2011

(86) PCT No.: PCT/GB2011/052520
§ 371 (c)(1),
(2), (4) Date: Jun. 14, 2013

(87) PCT Pub. No.: WO2012/080757
PCT Pub. Date: Jun. 21, 2012

(65) Prior Publication Data
US 2013/0266405 A1    Oct. 10, 2013

Related U.S. Application Data

(60) Provisional application No. 61/424,993, filed on Dec. 20, 2010.

(30) Foreign Application Priority Data

Dec. 17, 2010 (GB) .................................. 1021422.9

(51) Int. Cl.
*B65G 1/133* (2006.01)
*H01L 21/677* (2006.01)

(52) U.S. Cl.
CPC .... *H01L 21/67745* (2013.01); *H01L 21/67742* (2013.01)

(58) Field of Classification Search
CPC ................... H01L 21/67742; H01L 21/67745; B25J 18/025; B25J 9/102
USPC ............... 414/217, 749.1; 74/490.01, 490.03; 901/16, 25, 26
See application file for complete search history.

(56) References Cited

U.S. PATENT DOCUMENTS

| | | | | |
|---|---|---|---|---|
| 4,433,951 A | * | 2/1984 | Koch et al. | ..................... 414/217 |
| 4,435,120 A | * | 3/1984 | Ikeda et al. | .................... 414/735 |

(Continued)

FOREIGN PATENT DOCUMENTS

| | | |
|---|---|---|
| GB | 1395058 A | 5/1975 |
| JP | 63272474 A | 11/1988 |
| JP | 10296666 A | 11/1998 |

OTHER PUBLICATIONS

GB Search Report dated Apr. 13, 2011, from corresponding GB application.

(Continued)

*Primary Examiner* — Saul Rodriguez
*Assistant Examiner* — Mark Hageman
(74) *Attorney, Agent, or Firm* — Young & Thompson

(57) ABSTRACT

A work piece transfer mechanism for use in a chamber has at least one port through which a work piece may be passed along a linear work piece transfer path between a retracted location inside the chamber and an extended location outside the chamber. The chamber has a predetermined internal dimension of given axial extent in the direction of the transfer path, and the transfer mechanism includes a work piece support movable with a linear stroke. The work piece support is driven along the linear stroke by a drive lever pivotally attached to the work piece support by a pivot, and the drive lever is drivable such that the pivot is driven along a linear path to move the work piece support along the linear work piece transfer path. The linear work piece transfer path includes a portion beyond the port of axial extent greater than predetermined internal dimension.

24 Claims, 6 Drawing Sheets

(56) References Cited

U.S. PATENT DOCUMENTS

| | | | |
|---|---|---|---|
| 4,643,627 A * | 2/1987 | Bednorz et al. | 414/217 |
| 5,186,718 A | 2/1993 | Tepman et al. | |
| 6,305,895 B1 | 10/2001 | Ozawa et al. | |
| 7,306,423 B2 * | 12/2007 | Ogawa et al. | 414/749.1 |
| 8,382,421 B2 * | 2/2013 | Musha et al. | 414/744.5 |
| 2003/0035705 A1 * | 2/2003 | Johnson | 414/217 |
| 2005/0183533 A1 * | 8/2005 | Tillmann | 74/490.03 |
| 2008/0152463 A1 | 6/2008 | Chidambaram et al. | |

OTHER PUBLICATIONS

International Search Report dated May 4, 2012, from corresponding PCT application.

* cited by examiner

WORK PIECE TRANSFER MECHANISMS

BACKGROUND OF THE INVENTION

1. Field of the Invention

This invention relates to an improved transfer mechanism in particular, but not exclusively for transferring articles into and out of a confined area such as a vacuum treatment chamber, and to equipment incorporating such mechanisms.

2. Description of the Related Art

Known vacuum chambers might typically employ a rack and pinion type mechanism within the chamber which extends through a port in the chamber and includes a table which can be loaded with work pieces. The table is then retracted using the rack and pinion mechanism into the chamber. The rack and pinion type mechanisms employed in known mechanisms typically achieve a maximum reach out of the chamber of less than 70% of the chamber width or diameter. However it is very desirable to reach further out of the vacuum chamber with a simple transfer mechanism, to improve the layout of the processing area surrounding the chamber. Thus the ratio of the reach of a transfer mechanism compared to the area that it occupies in its closed state is an important benchmark. Where a transfer mechanism is used in a vacuum chamber, for example an ultra high vacuum (UHV) chamber, purely mechanical devices are preferred.

In some instances, it is preferred that a work piece in a confined space such as a vacuum chamber is loaded into the chamber through one port and unloaded through another port. Therefore, it is desirable also that the transfer mechanism employed is rotatable to achieve the different transfer directions.

BRIEF SUMMARY OF THE INVENTION

The present invention is, in embodiments, directed to addressing the problems mentioned above.

According to one aspect, this invention provides a work piece transfer mechanism for use in a chamber having at least one port through which a work piece may be passed along a linear work piece transfer path between a retracted location inside the chamber and an extended location outside the chamber, the chamber having a predetermined internal dimension of given axial extent in the direction of said work piece transfer path, the work piece transfer mechanism including a work piece support movable with a linear stroke, the work piece support being driven along said linear stroke by means of a drive lever pivotally attached to the work piece support by means of a pivot, said drive lever being drivable such that the pivot is driven along a linear path to move said work piece support along said linear work piece transfer path, wherein said linear work piece transfer path comprises a portion beyond said port of axial extent greater than predetermined internal dimension.

According to another aspect, a work piece transfer mechanism for use in a chamber having at least one port through which a work piece may be passed along a linear work piece transfer path between a retracted location inside the chamber and an extended location outside the chamber, the chamber having a predetermined internal dimension of given axial extent in the direction of said work piece transfer path, the work piece transfer mechanism including a work piece support movable with a linear stroke, the work piece support being driven along said linear stroke by means of a drive lever pivotally attached to the work piece support by means of a pivot, said drive lever being drivable such that the pivot is driven along a linear path to move said work piece support along said linear work piece transfer path, wherein the midpoint of the linear path of the pivot is offset from the midpoint of the predetermined internal dimension of the chamber, in a direction towards said port.

According to a yet another aspect, the invention provides a work piece transfer mechanism, including a work piece support moveable with a linear stroke, the work piece support being drivable in said linear stroke by means of a drive lever pivotally attached to the work piece support by means of a pivot, said drive lever being drivable such that the pivot is driven along a linear path parallel with said substantially linear stroke.

Where the mechanism is used in a confined space such as for example a vacuum chamber, the mechanism is conveniently such as to provide a linear stroke of length greater than the chamber dimensions.

In an embodiment the drive lever is driven by a plurality of rotary elements which describe the linear path of the pivot.

Conveniently the plurality of rotary elements forms an epicycloid straight line linkage, which could be for example a Cardan mechanism.

In an embodiment the plurality of rotary elements, or the Cardan mechanism includes a fixed gear and a carriage rotatably mounted about the effective centre of the fixed gear, said carriage supporting a first idler gear including first idler gear teeth in intermeshing engagement with teeth of the fixed gear, the carriage rotatably supporting a second drive gear including teeth in intermeshing engagement with the teeth of the first idler gear, the second drive gear being non-rotatably connected to the drive lever, the arrangement being such that rotational driving of the carriage causes rotation of the first idler gear with respect to the fixed gear, which in turn produces rotation of the second drive gear and the drive lever, the ratios of the effective diameters of the respective gears being such that the said pivot is caused to move along said linear path.

Depending on the size of the passage through a port the drive arm may be arcuate to allow the effective length thereof to be increased without engaging the walls defining the port.

Preferably the mechanism includes an anti-backlash provision. This may comprise a spring biasing the drive lever. Conveniently the spring is a spiral or clock spring adapted to provide a bias force throughout the stroke of movement in both directions of movement.

Preferably, said carriage is caused to rotate about the centre of the fixed gear by means of a further drive gear, driven by a driving pinion.

In an embodiment the work piece support is mounted for movement on or in a telescoping support arm.

The fixed gear may be part-circular, e.g. segment-shaped or sector-shaped with teeth around the circular part only of the periphery. In an embodiment said carriage is rotated by the further drive gear and pinion through approximately 180 degrees from a starting position, to effect said linear stroke of the work support to its maximum extent and is rotatable in the opposite sense back through the 180 degrees to move the work support in the opposite linear direction to the starting position of the work support.

In an embodiment the transfer mechanism further includes a drive for rotatably driving said drive pinion to cause said linear stroke.

Conveniently the drive further includes a lift for lifting and lowering said transfer mechanism in a direction substantially transverse to the linear stroke.

Preferably, the drive provides for rotating the transfer mechanism about an axis generally transverse to the linear stroke.

More preferably, said axis is coincident with a driving axis of the drive pinion.

Conveniently, said axis is offset relative to the centre of the fixed gear.

In addition, said axis may be parallel or coincident with the direction of lifting and lowering.

According to a second aspect there is provided a vacuum chamber including a transfer mechanism as described above.

In an embodiment, the chamber includes a chamber body and said drive is external to said body.

In an embodiment said chamber body includes more than one radial port and the rotation of the mechanism about the axis allows the work piece support to be passed through each of said more than one radial port along the path of said linear stroke.

In an embodiment, the chamber is generally cylindrical in plan and the stroke of the transfer mechanism exceeds the diameter of the chamber.

BRIEF DESCRIPTION OF THE DRAWINGS

The invention can be put into effect in numerous ways, one embodiment only being described below by way of example only, with reference to the drawings wherein.

DETAILED DESCRIPTION OF THE PREFERRED EMBODIMENTS

Figure 1:
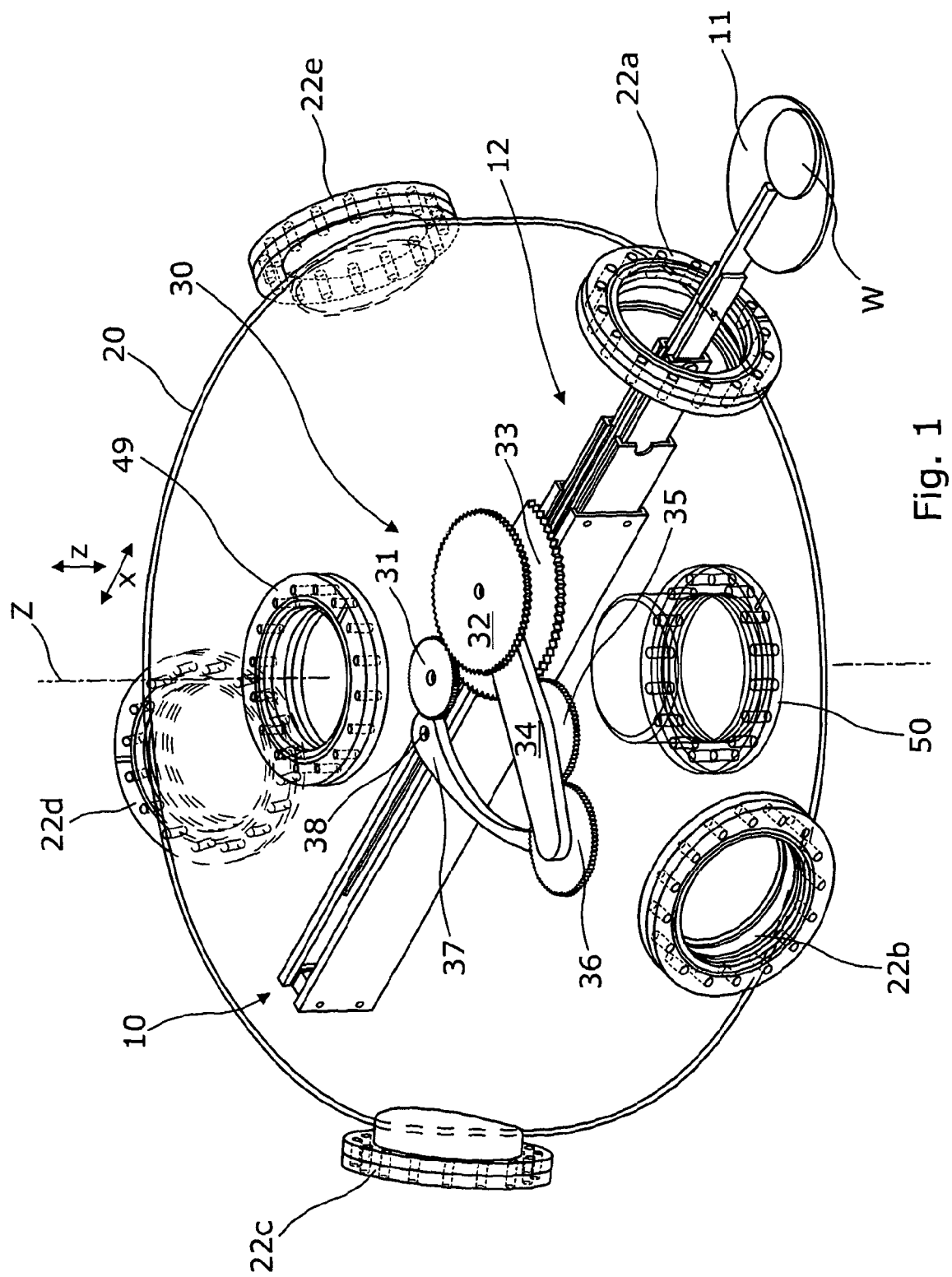
FIG. 1 shows a pictorial view of a transfer mechanism according to the invention, housed within a vacuum chamber.

FIG. 1 shows a transfer mechanism 10 housed generally within an ultra high vacuum (UHV) chamber 20. The chamber 20 will, generally, be what is know as a pancake chamber of flat cylindrical form, serving as the hub of a plurality of chambers connected to the pancake by a number of radial ports, 22a to 22e for example. The chamber has two axial ports 49 and 50, to the upper one 49 of which is connected the drive mechanism 40 as described below, the lower one 50 being available for pumping for example. The transfer mechanism 10 includes a telescopic arm 12, described in more detail below, which supports a work piece support 11 which can be passed with linear motion into and out of the chamber 20 via the radial access ports 22a to 22e. The telescopic arm 20 is driven with a reciprocal linear stroke by means of an epicycloid linear mechanism, which here is in the form of a Cardan gear and lever mechanism shown generally by the reference 30. The Cardan mechanism includes a drive pinion 31, a further drive gear 32, a fixed gear segment 33, a driven carriage 34 non-rotatably secured to the further drive gear 32, an idler gear 35 in intermeshing engagement with the fixed gear segment 33, and a second drive gear 36 having rigidly connected thereto a drive lever 37. The drive lever 37 is connected to a pivot pin 38 which is secured to the end of a member of the telescopic arm 12.

The operation of the Cardan mechanism is described in more detail below, but the drive lever 37 moves the pivot pin in a linear path without side loads. The transfer mechanism 10, in use, can rotate wholly about a Z axis generally central to the chamber 20. Thus, the linear stroke of the telescopic arm 12 can be in any radial direction in a plane transverse to the Z axis. In addition, the transfer mechanism 10 can be traversed along the Z axis (in the Z direction). Thus, the transfer mechanism can be used to pick up work pieces W from outside the chamber 20, by means of lifting them in the Z direction prior to bringing them into the chamber 20. Once in the chamber 20 the work piece can be rotated about the Z axis, for transfer via a further port if required, or for unloading from the chamber 20.

Figure 2:
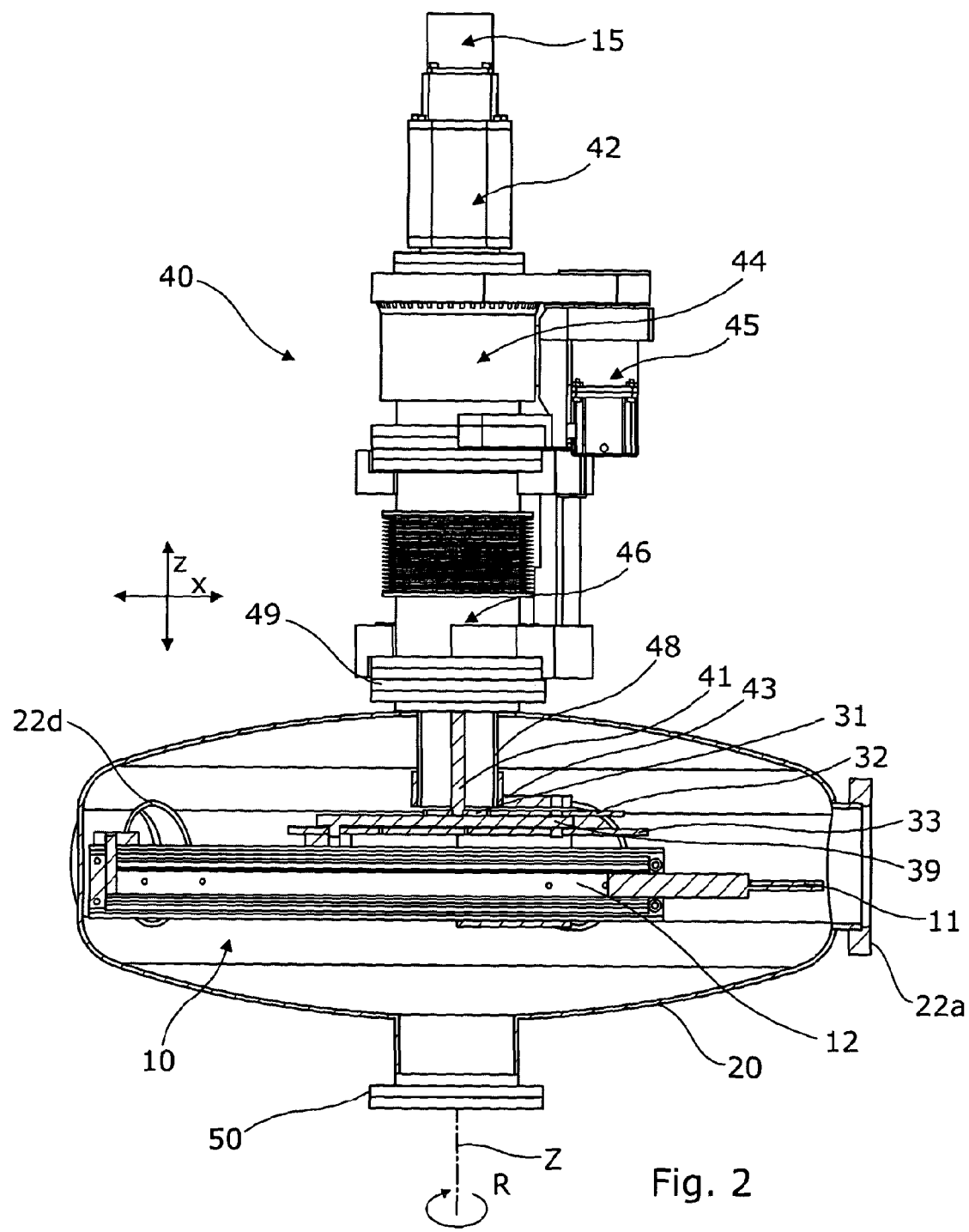
FIG. 2 shows the vertical section through the transfer mechanism within the chamber and an external drive.

FIG. 2 is a vertical section through the Z axis, showing additionally a drive 40 for driving the transfer mechanism 10. The drive 40 includes a drive shaft 41 which, in use rotates the drive pinion 31 of the Cardan mechanism in clockwise and anticlockwise directions to extend and retract the telescopic arm 12. The drive shaft 41 is disposed concentrically within a drive tube 48 which itself is rigidly connected to the transfer mechanism 10 via a mounting bracket 43. Rotation of the drive tube 48 revolves the whole transfer mechanism 10 about the Z axis in the direction of arrows R to angularly move the telescopic arm to align with different ports 22a to 22e. The drive 40 is rigidly connected to the vacuum chamber 20 at a mounting flange of axial port 49. The drive 40 further includes a drive motor 15 for driving the drive shaft 41, via a concentric magnetic coupling 42. A further drive motor 45 in use rotates the drive tube 48 via a further concentric magnetic coupling 44. The magnetic couplings 42, 44 each comprise an external drive element magnetically coupled to an internal drive element. The drive 40 further includes a Z shift mechanism 46 which provides translational movement of the drive tube 48 along the Z axis, to shift the transfer mechanism 10 in the Z direction. The motor 15 and external drive element of magnetic coupling 42 for turning the drive pinion 31 via drive shaft 41, are mounted on the external drive element of the magnetic coupling 44, so that the external drive element of coupling 42 rotates with the external drive element of coupling 44 as it is rotated. In practice this ensures that the drive tube 48 and the drive pinion 31 will rotate together, unless the motor 15 is activated. This avoids complicated synchronisation of the rotation of the whole transfer mechanism and the rotation of the drive pinion 31.

Shown in FIG. 2 also are sections through the drive pinion 31, the driven gear 32 and the static gear segment 33. The static gear 33 is mounted to the telescopic arm 12 by means of a mounting frame 39.

Figure 3:
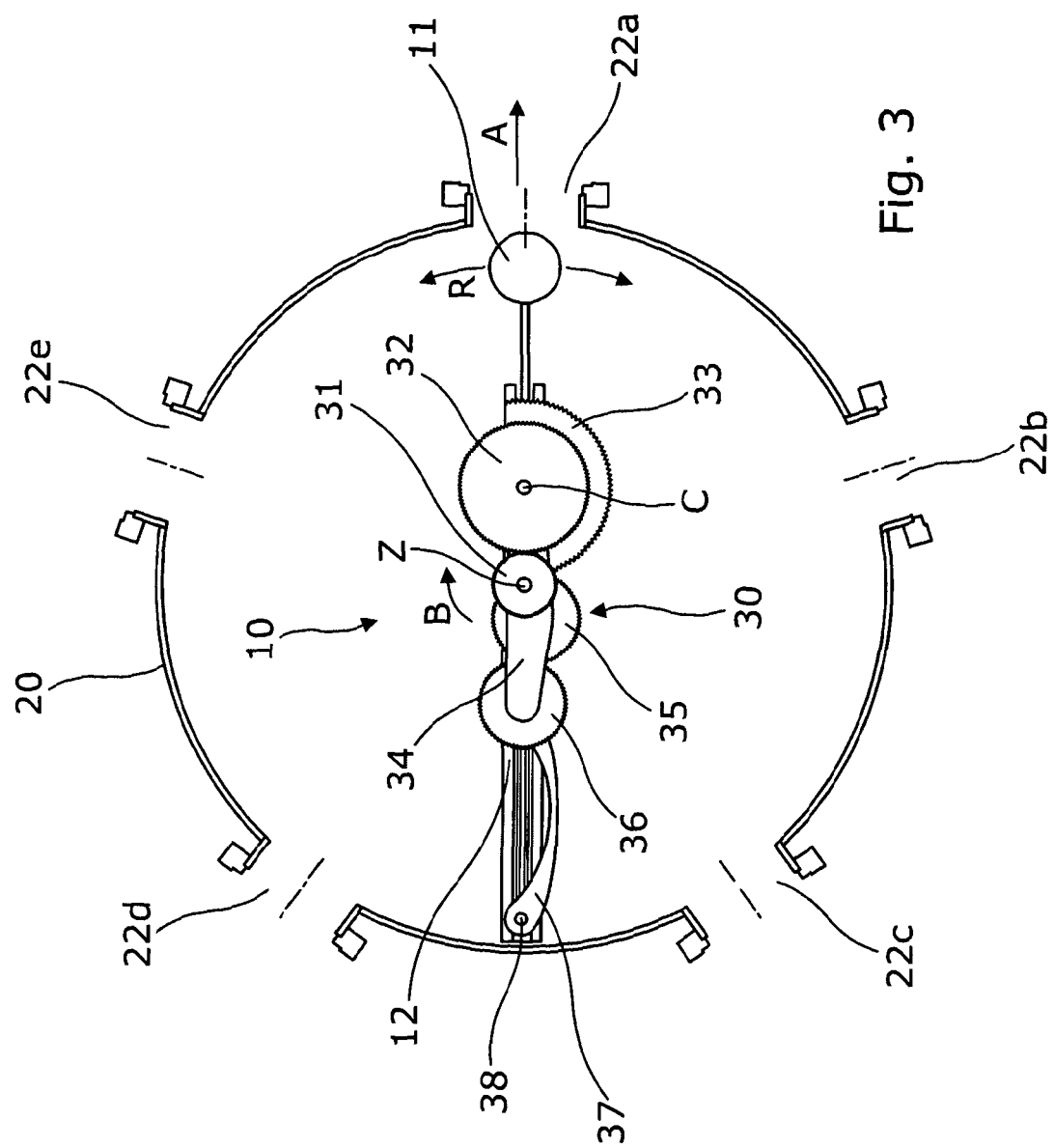
FIGS. 3, 4 and 5 show a plan view of the mechanism in three states of operation.

FIG. 3 shows a section through the vacuum chamber 20, showing a plan view of the transfer mechanism 10. The chamber 20 shown includes 5 access ports, 22a, b, c, d and e. Otherwise the chamber 20 is identical to the chamber shown in the previous Figures. The mechanism 10 can be rotated about the Z axis, which in this embodiment coincides with the axis of the drive pinion 31. In that case, the work piece support 11 will rotate in the direction of arrows R. The work piece support 11 is also moveable with linear movement in the direction of arrow A. The linear movement is provided by a telescopic sliding arm 12, driven by the Cardan mechanism 30.

In use, the drive pinion 31 is rotated in the direction of arrow B. This in turn causes the driven gear 32 to rotate in the opposite direction. Carriage 34 is rigidly connected to the driven gear 32 and rotates in the same direction as that gear. This motion causes the idler gear 35 to orbit around the fixed gear segment 33. The idler gear 35 is rotatably supported on the arm 34. The orbiting and rotating motion of the idler gear 35 in turn causes rotation of a further gear 36. A drive lever 37 is rigidly connected to the further gear 36 and rotates therewith. The distal end of the guide lever 37 is connected to a pivot pin 38, in turn attached to the telescopic arm 12.

The arrangement of the Cardan gears is such that the pivot pin 38 is driven in the direction of arrow A with linear motion.

In turn, this forces the work piece support 11 in the direction of arrow A to exit the chamber to transfer a work piece supported thereon. This linear movement is a function of the gearing and linkages of the Cardan mechanism, and is not necessarily dependent on the constraint of the telescopic arm or other constraint.

Figure 4:
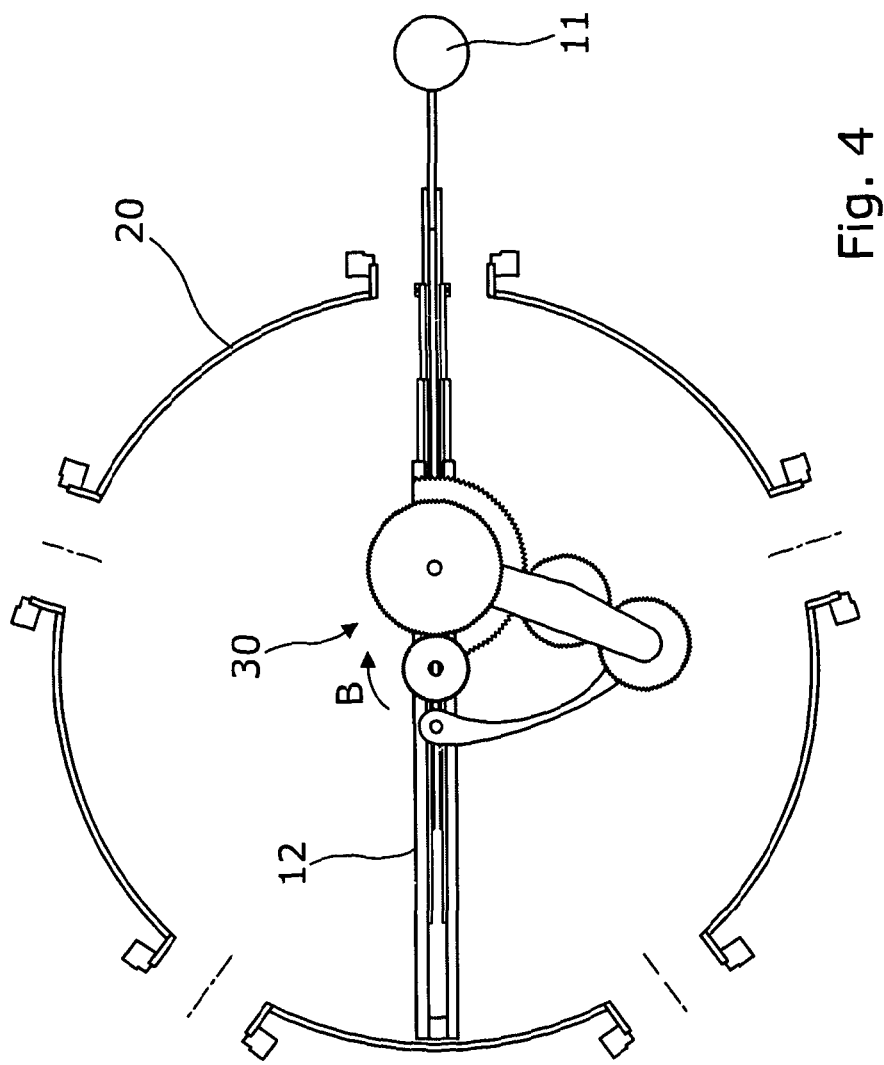

FIG. 4 shows the Cardan mechanism approximately half way through its stroke and showing the telescopic arm 12 partially extended.

Figure 5:
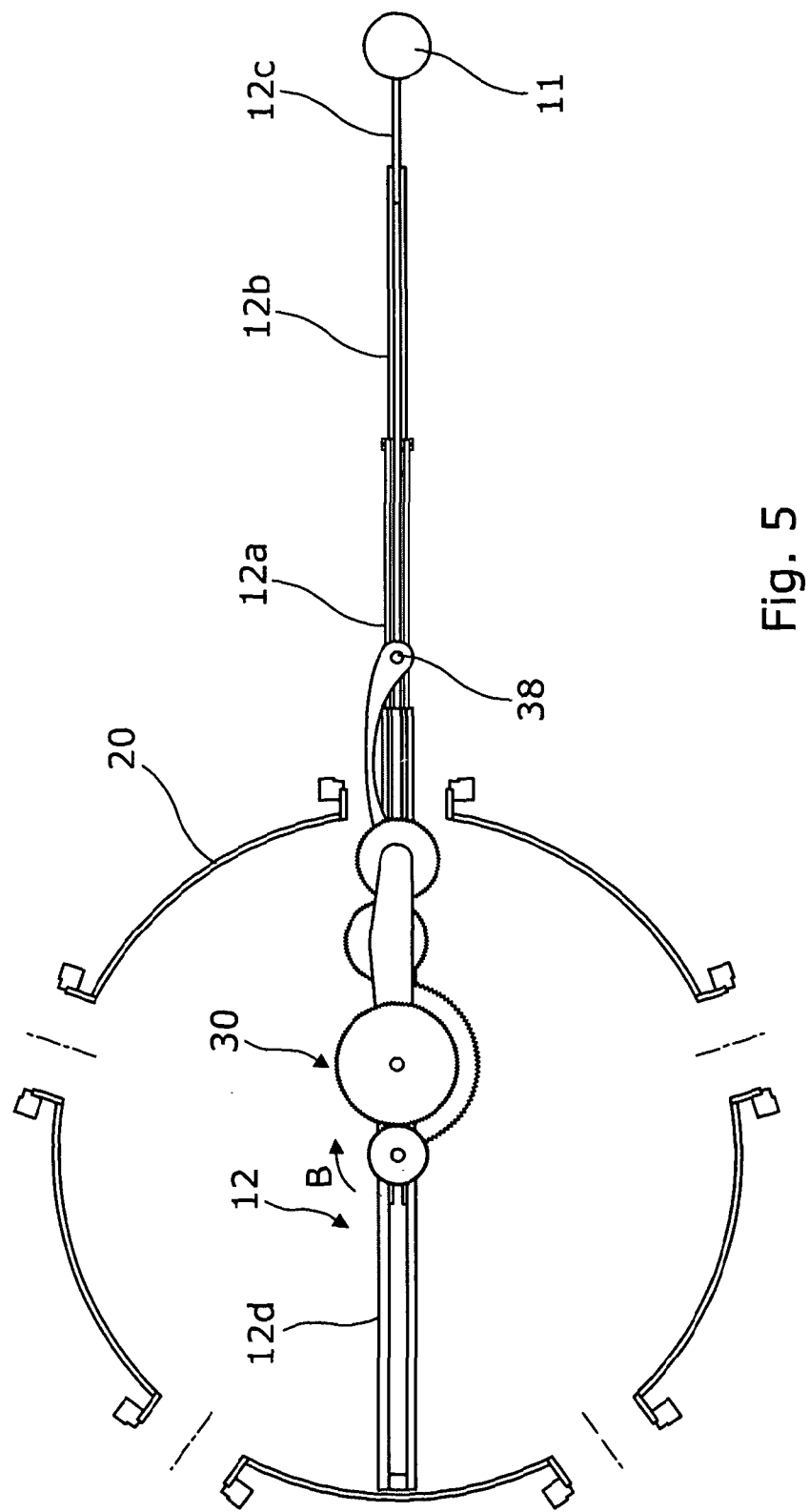

FIG. 5 shows the Cardan mechanism at full stroke with the telescopic arm 12 fully extended. In this view the construction of the telescopic arm 12 is more clearly shown. The arm 12 includes an outer section 12*d* and inner sections 12*a*, 12*b* and 12*c*. In this construction, the inner section 12*c* extends from the work piece support 11 to the pivot pin 38 and is supported in its extended condition by the sections 12*d*, 12*a* and 12*b*. In this embodiment, ball bearings are employed between the sections to provide rolling support. When extended, the mechanism 10 can be used to pick up work pieces, for example semiconductor material which is to be treated, or which has already been treated, by means of chemical vapour deposition. Rotation of the drive pinion 31 in the direction opposite to direction B, moves the mechanism back to its starting position as shown in FIG. 3.

Referring to FIGS. 3, 4 and 5 it will be noted that the drive pinion 31 and further driven gear 32 allow the Cardan mechanism to have a carriage 34 which rotates about the drive Z axis, which is offset in the direction A from the axes of the chamber and the drive shaft 41. This results in a greater throw of the lever arm 37 in the direction of arrow A and consequently a greater reach of the mechanism outside the chamber 20. In this embodiment, the drive pinion 31 and further drive gear 32 form additional gears to a standard Cardan mechanism and offset the centre C of the Cardan mechanism, at the centre of the fixed gear 32, from the generally central Z axis of the chamber.

One embodiment only has been described above and illustrated, however, it will be apparent to the skilled addressee that modifications, variants, omissions and additions are possible within the scope of the invention. The Cardan mechanism described uses a gear segment 33 and is driven in both clockwise and anti clockwise directions for transfer of the work piece support 11. However, the Cardan mechanism 30 will operate in a satisfactory reciprocal manner if it is driven only in one sense and if the static gear 33 is made whole. Although the transfer mechanism provides angular movement about a Z axis and radial movement in the X-Y plane, it will be appreciated that this mechanism could be used in applications where there was no angular movement.

The invention has been described as employed with a UHV chamber 20. However, other applications for the transfer mechanism are envisaged. For example, the mechanism 10 could be employed externally to apparatus that needs to be loaded and unloaded with linear motion, for example a long narrow furnace or other work treatment area. The transfer device 10 provides a stroke for the work piece support 11 which is greater than the dimensions of the chamber 20, and thus the stroke is greater than that achievable by means of other transfer mechanisms.

Figure 6:
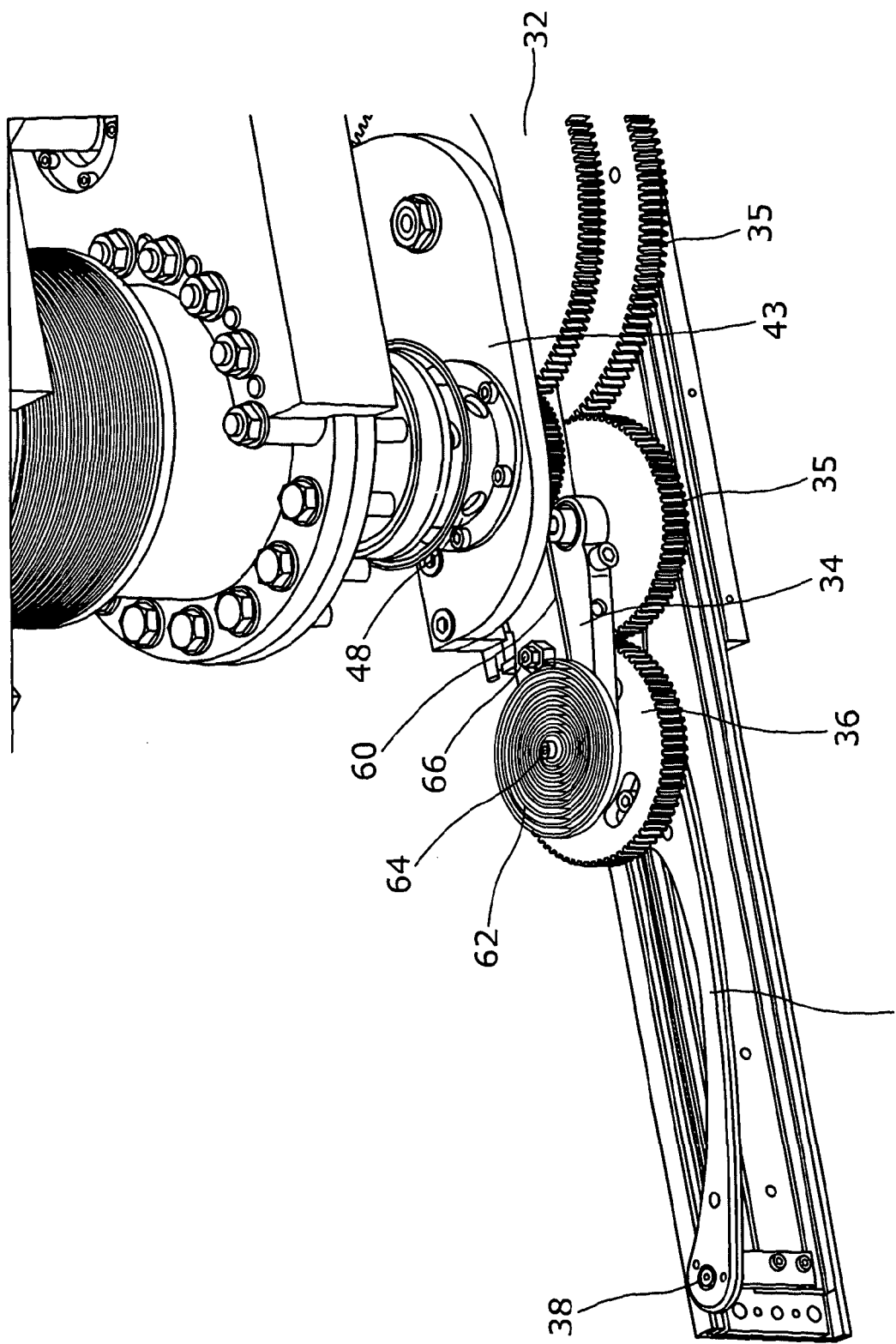
FIG. 6 illustrates an anti-backlash arrangement for the mechanism.

Referring now to FIG. 6, in this modification the mechanism is provided with two anti-backlash features. Firstly, a flexure feature 60 within arm 34 is provided which urges the idler gear 35 in a radial direction towards a notional line connecting the centres of the fixed gear 33 and the second drive gear 36, to maintain tight meshing engagement between the three gears and to reduce backlash. Secondly, a spiral clock spring 62 provides a continuous bias torque on the second drive gear 36 to bias the entire drive train back to the motor in one direction throughout the range of angular movement of the second drive gear. The inner end of the spring is attached to a shaft 64 which rotates with the second gear, and the outer end is fixed to an anchorage 66 provided on the lever 34.

The invention claimed is:

1. A work piece arrangement, comprising:
    a chamber (20) having at least one port (22) through which a work piece may be passed along a linear work piece transfer path between a retracted location inside the chamber and an extended location outside the chamber, the chamber having a predetermined internal dimension of given axial extent in a direction of said linear work piece transfer path,
    a work piece transfer mechanism disposed in said chamber,
    the work piece transfer mechanism including a work piece support (11, 12) movable with a linear stroke,
    a drive lever (37) that drives the work piece support along said linear stroke, the drive lever (37) pivotally attached to the work piece support by a pivot,
    said drive lever being drivable such that the pivot is driven along a linear path to move said work piece support along said linear work piece transfer path,
    wherein said linear work piece transfer path comprises a portion beyond said port of axial extent greater than said predetermined internal dimension, and
    wherein the drive lever is driven by an arrangement including a plurality of rotary elements that form an epicycloid linear mechanism which describes the linear path of the pivot.

2. The arrangement as claimed in claim 1, wherein the plurality of rotary elements form a Cardan mechanism.

3. The arrangement as claimed in claim 1, wherein the plurality of rotary elements includes a fixed gear (33), and a carriage (34) rotatably mounted about the effective centre of the fixed gear (33), said carriage (34) supporting a first idler gear (35) including first idler gear teeth in intermeshing engagement with teeth of the fixed gear (33), the carriage rotatably (34) supporting a second drive gear (36) including teeth in intermeshing engagement with the teeth of the first idler gear (35), the second drive gear (36) being non-rotatably connected to the drive lever (37), the arrangement being such that rotational driving of the carriage (34) causes rotation of the first idler gear (35) with respect of the fixed gear (33), which in turn produces rotation of the second drive gear (36) and the drive lever (37), the ratios of the effective diameters of the respective gears (33, 35, 36) being such that the said pivot (38) is caused to move along said linear path.

4. The arrangement as claimed in claim 3, wherein said carriage (34) is caused to rotate about the centre of the fixed gear (33) by means of a further drive gear (32), driven by a driving pinion (31).

5. The arrangement as claimed in claim 4, wherein, in use, said carriage (34) is rotated by the further drive gear (32) and the driving pinion (31) through approximately 180 degrees from a starting position, to effect said linear stroke of the work piece support (11) to its maximum extent and is rotatable in the opposite sense back through the 180 degrees to move the work support in the opposite linear direction to the starting position of the work support.

6. The arrangement as claimed in claim 4, wherein the transfer mechanism further includes a drive (15, 42, 41) for rotatably driving said driving pinion (31) to cause said linear stroke.

7. The arrangement as claimed in claim 6, wherein the drive further includes a lift (46) for lifting and lowering said transfer mechanism in a direction substantially transverse to the linear stroke.

8. The arrangement as claimed in claim 7, including a drive (45, 44, 48) for rotating the transfer mechanism about an axis (7) generally transverse to the linear stroke.

9. The arrangement as claimed in claim 8, wherein said axis (7) is parallel or coincident with the direction of lifting and lowering.

10. The arrangement as claimed in claim 4, including a drive (45, 44, 48) for rotating the transfer mechanism about an axis (7) generally transverse to the linear stroke wherein the said axis is coincident with a driving axis of the driving pinion.

11. The arrangement as claimed in claim 4, including a drive (45, 44, 48) for rotating the transfer mechanism about an axis (7) generally transverse to the linear stroke wherein said axis (7) is offset relative to the centre of the fixed gear (33).

12. The arrangement as claimed in claim 1, wherein the work piece support (11) is mounted for movement on or in a telescoping support arm (12).

13. The arrangement as claimed in claim 1, including an anti-backlash arrangement for providing a bias throughout the operational movement of the said drive lever.

14. The arrangement as claimed in claim 13, wherein said anti-backlash arrangement acts on said drive lever.

15. The arrangement as claimed in claim 14 wherein said anti-backlash arrangement applies a continuous torque to said drive lever.

16. The arrangement as claimed in claim 15, wherein said anti-backlash arrangement comprises a spiral spring element.

17. The arrangement as claimed in claim 1, wherein, in the extended location outside the chamber, a maximum extension of a distal end (11) of the work piece support from the at least one port (22) is greater than an inside diameter of the chamber (20).

18. A work piece arrangement, comprising:
   a chamber (20) having at least one port (22) through which a work piece may be passed along a linear work piece transfer path between a retracted location inside the chamber and an extended location outside the chamber, the chamber having a predetermined internal dimension of given axial extent in the direction of said linear work piece transfer path,
   a work piece transfer mechanism disposed in said chamber, the work piece transfer mechanism including a work piece support (11, 12) movable with a linear stroke,
   a drive lever (37) that drives the work piece support along said linear stroke, the drive lever (37) pivotally attached to the work piece support by a pivot,
   said drive lever being drivable such that the pivot is driven along a linear path to move said work piece support along said linear work piece transfer path,
   wherein the midpoint of the linear path of the pivot is offset from the midpoint of the predetermined internal dimension of the chamber in a direction towards said port, and
   wherein the drive lever is driven by an arrangement including a plurality of rotary elements that form an epicycloid linear mechanism which describes the linear path of the pivot.

19. The arrangement as claimed in claim 18, wherein, in the extended location outside the chamber, a maximum extension of a distal end (11) of the work piece support from the at least one port (22) is greater than an inside diameter of the chamber (20).

20. A vacuum chamber, comprising a work piece arrangement that includes
   i) a chamber (20) having at least one port (22) through which a work piece may be passed along a linear work piece transfer path between a retracted location inside the chamber and an extended location outside the chamber, the chamber having a predetermined internal dimension of given axial extent in a direction of said linear work piece transfer path,
   ii) a work piece transfer mechanism disposed in said chamber, the work piece transfer mechanism including a work piece support (11, 12) movable with a linear stroke,
   iii) a drive lever (37) that drives the work piece support along said linear stroke, the drive lever (37) pivotally attached to the work piece support by a pivot, and
   iv) a drive arrangement that drives said drive lever such that the pivot is driven along a linear path to move said work piece support along said linear work piece transfer path,
   wherein said linear work piece transfer path comprises a portion beyond said port of axial extent greater than said predetermined internal dimension, and
   wherein the drive arrangement includes a plurality of rotary elements that form an epicycloid linear mechanism which describes the linear path of the pivot.

21. The vacuum chamber as claimed in claim 20, wherein the chamber (20) includes a chamber body and a prime mover for said transfer mechanism is external to said body.

22. The vacuum chamber as claimed in claim 20, wherein said chamber body includes a plurality of radially spaced ports (22) and wherein the workpiece transfer mechanism is rotatable about an axis to allow the work piece support to be selectively passed through each of said plurality of ports along the path of said linear stroke.

23. The vacuum chamber as claimed in claim 20, wherein the chamber (20) is generally cylindrical in plan and the stroke of the transfer mechanism exceeds a diameter of the chamber.

24. The vacuum chamber as claimed in claim 1, wherein, in the extended location outside the chamber, a maximum extension of a distal end (11) of the work piece support from the at least one port (22) is greater than an inside diameter of the chamber (20).

* * * * *